United States Patent
Bernier et al.

(10) Patent No.: US 6,255,208 B1
(45) Date of Patent: Jul. 3, 2001

(54) SELECTIVE WAFER-LEVEL TESTING AND BURN-IN

(75) Inventors: William Emmett Bernier, Endwell, NY (US); Claude Louis Bertin, South Burlington, VT (US); Anilkumar Chinuprasad Bhatt, Johnson City; Michael Anthony Gaynes, Vestal, both of NY (US); Erik Leigh Hedberg, Essex Junction, VT (US); Nikhil M. Murdeshwar, Abington, PA (US); Mark Vincent Pierson, Binghamton, NY (US); William R. Tonti, Essex Junction, VT (US); Paul A. Totta, Poughkeepsie, NY (US); Joseph John Van Horn, Underhill; Jerzy Maria Zalesinski, Essex Junction, both of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/236,927

(22) Filed: Jan. 25, 1999

(51) Int. Cl.[7] .................................................... H01L 21/44
(52) U.S. Cl. ............................ 438/613; 438/612; 438/614
(58) Field of Search ............................... 438/612, 613, 438/614, 615, 616, 617; 228/180.1, 180.2, 180.21

(56) References Cited

U.S. PATENT DOCUMENTS

| | | |
|---|---|---|
| 3,795,047 | 3/1974 | Abolafia et al. . |
| 4,442,966 | 4/1984 | Jourdain et al. . |
| 4,661,192 | 4/1987 | McShane . |
| 4,744,850 | 5/1988 | Imano et al. . |
| 5,221,417 | 6/1993 | Basavanhally . |
| 5,289,631 | 3/1994 | Koopman et al. . |
| 5,374,893 | 12/1994 | Koopman et al. . |
| 5,541,524 | 7/1996 | Tuckerman et al. . |
| 5,633,204 * | 5/1997 | Tago et al. ............................ 438/614 |
| 5,661,042 | 8/1997 | Fang et al. . |
| 5,663,654 | 9/1997 | Wood et al. . |
| 5,672,979 | 9/1997 | Christopher . |
| 5,685,939 | 11/1997 | Wolk et al. . |
| 5,686,353 * | 11/1997 | Yagi et al. ............................ 438/614 |
| 5,686,703 | 11/1997 | Yamaguchi . |
| 5,908,317 * | 6/1999 | Heo ....................................... 438/617 |
| 6,068,175 * | 5/2000 | Heim et al. ...................... 228/180.21 |

FOREIGN PATENT DOCUMENTS 3-284857   12/1991   (JP) .

* cited by examiner

*Primary Examiner*—Kevin M. Picardat
(74) *Attorney, Agent, or Firm*—Schmeiser, Olsen & Watts; Robert A. Walsh

(57) ABSTRACT

Selective electrical connections between an electronic component and a test substrate are made using an electrical conductive material. The conductive material of the present invention is a dissolvable material, allowing for rework and repair of a wafer at the wafer-level, and retesting at the wafer-level. In addition, the conductive material may also be used in a permanent package, since the conductive material of the present invention provides complete electrical conductivity and connection between the electronic component and the substrate.

18 Claims, 4 Drawing Sheets

SELECTIVE WAFER-LEVEL TESTING AND BURN-IN

BACKGROUND OF THE INVENTION

1. Technical Field

The invention relates generally to semiconductor devices, and more specifically, to wafer-level testing and burn-in for semiconductor devices.

2. Background Art

Prior to shipping, semiconductor devices are generally subjected to a series of test procedures in order to confirm functionality and yield, and to assure quality and reliability. This testing procedure conventionally includes probe testing and burn-in testing, which are generally done after a wafer is diced into individual chips, and many times, after the chips are packaged.

Considerable interest exists in methods for performing wafer-level burn-in of semiconductor devices to determine known good die per wafer before wafers are separated into individual chips. Examples of wafer-level testing are found in the following U.S. Patents: U.S. Pat. No. 5,661,042, "Process for Electrically Connecting Electrical Devices Using a Conductive Anisotropic Material," issued to Fang et al.; and U.S. Pat. No. 5,663,654, "Universal Wafer Carrier for Wafer Level Die Burn-In," issued to Wood et al. In the aforementioned patents, electrical contact is made between a semiconductor wafer and the test or probe substrate through conductive material to allow for wafer-level testing.

Unfortunately, the conductive material described is deposited over the entire wafer, not allowing for selective testing of the wafer. Furthermore, the conductive material is generally temporary, not providing for a possible permanent connection between the substrate and the wafer. Also, after a defect is found, the wafer then may be diced up, and the chip(s) identified on the wafer as defective may then be thrown out, but there is no convenient way to repair and rework the defective wafer at wafer-level.

SUMMARY OF THE INVENTION

It is thus an advantage of the present invention to provide a method and apparatus that eliminate the above described limitations.

The advantages of the invention are realized by a method and apparatus that provides for selective electrical connections between an electronic component and a test substrate using a conductive material. The conductive material of the present invention is a dissolvable material, allowing for rework and repair of a wafer at the wafer-level. In addition, the conductive material may also be used in a permanent package, since the conductive material of the present invention provides complete electrical conductivity and connection between the electronic component and the substrate.

The foregoing and other advantages and features of the invention will be apparent from the following more particular description of preferred embodiments of the invention, as illustrated in the accompanying drawings.

BRIEF DESCRIPTION OF THE DRAWINGS

The preferred exemplary embodiments of the present invention will hereinafter be described in conjunction with the appended drawings, where like designations denote like elements, and.

DETAILED DESCRIPTION OF THE DRAWINGS

Figure 1:
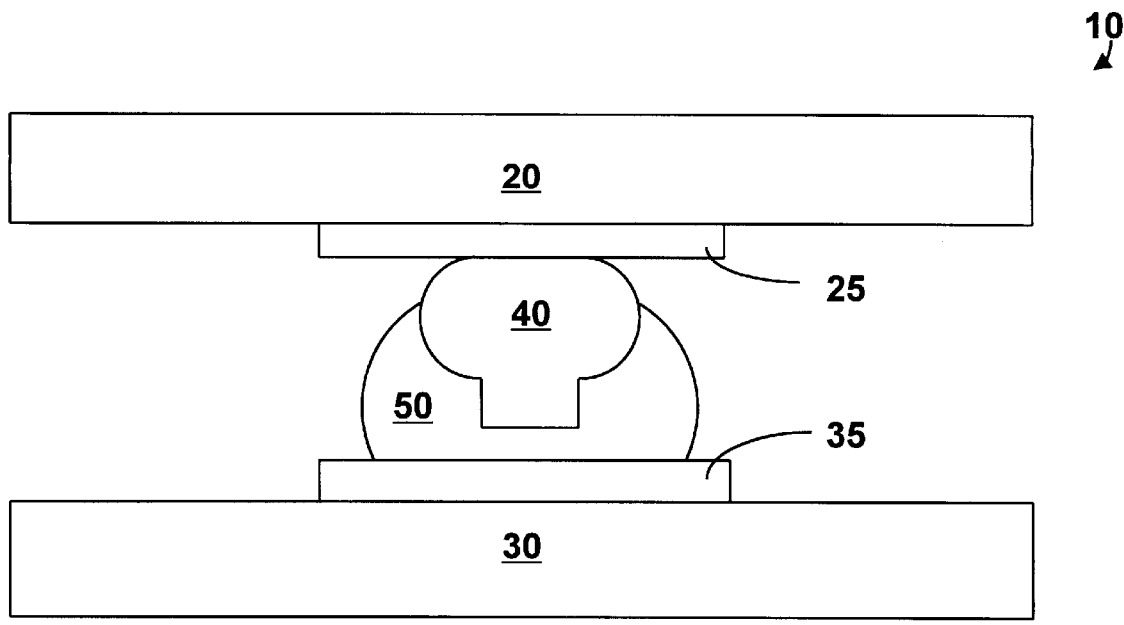
FIG. 1 is a cross-section of a bonded electronic component in accordance with a preferred embodiment of the present invention.

Referring to FIG. 1, a cross-sectional diagram of a bonded electronic component 10 having electronic component 20 with metallized pad 25, substrate 30 with metallized pad 35, component connector 40, and conductive material 50 in accordance with a preferred embodiment of the present invention is shown. Component connector 40 is electrically connected to electronic component 20 through metallized pad 25, and electrically connected to substrate 30 through conductive material 50, and metallized pad 35. Component connector 40 preferably comprises a gold stud bump, but may also be a bump, column, etc. made of gold, palladium, lead-tin solder, or any other acceptable material. One advantage of using a stud bump includes a reduced lead length between a chip and another device, which decreases lead inductance. This is particularly advantageous for memory, logic, and similar devices, since both speed and density may be increased. Metallized pads 25 and 35 may also be made of gold, palladium, nickel, molybdenum, etc.

Component connector 40 may be formed on electronic component 20 using a conventional wire bonder, and is flattened to form a ball with a slightly protruding stud of uniform height (e.g., +/−0.001" variation). Substrate 30, in this example, is a mating carrier with a matching metallized pad 35. Substrate 30 is preferably a carrier that has a matched thermo-coefficient of expansion to the material of electronic component 20. For example, if electronic component 20 is a silicon wafer, then substrate 30 may be a glass ceramic carrier, or a copper-invar-copper carrier, etc. Substrate 30 may also have test probes (e.g., platinum probes), which may be used in conjunction with conductive material 50 as described below.

Conductive material 50, which is deposited on either metallized pad 35 or component connector 40, bonds substrate 30 to electronic component 20. Conductive material 50 may be used alone to mate electronic component 20 to substrate 30, or in combination with existing test probes on a substrate, allowing for greater electrical conductivity of the test probes. Conductive material 50 is preferably an isotropic electrically conductive adhesive, such as a thermoplastic as discussed in greater detail in IBM Dkt. No. Y09-93-131, entitled "Lead-Free Conductive Composites for Electrical Interconnections" by Saraf et al., herein incorporated by reference. Thermoplastic, or similar material, is compliant. Thus, conductive material 50 expands and contracts with component connectors 40 instead of cracking from thermal movement resulting from burn-ins. This feature is particularly useful in a wafer having a high density of component connectors. The electrical connection formed allows the full wafer to be tested and burned in. Conductive material 50 is also dissolvable, as will be seen in subsequent examples and figures, thus allowing for rework and/or repair on a wafer-level. If permanency is desired, the electronic component 20 (e.g., bonded wafer), or individual chips diced from electronic component 20, and substrate 30 may be underfilled with conventional or reworkable underfills, encapsulating conductive material 50 and component connector 40.

Figure 2:
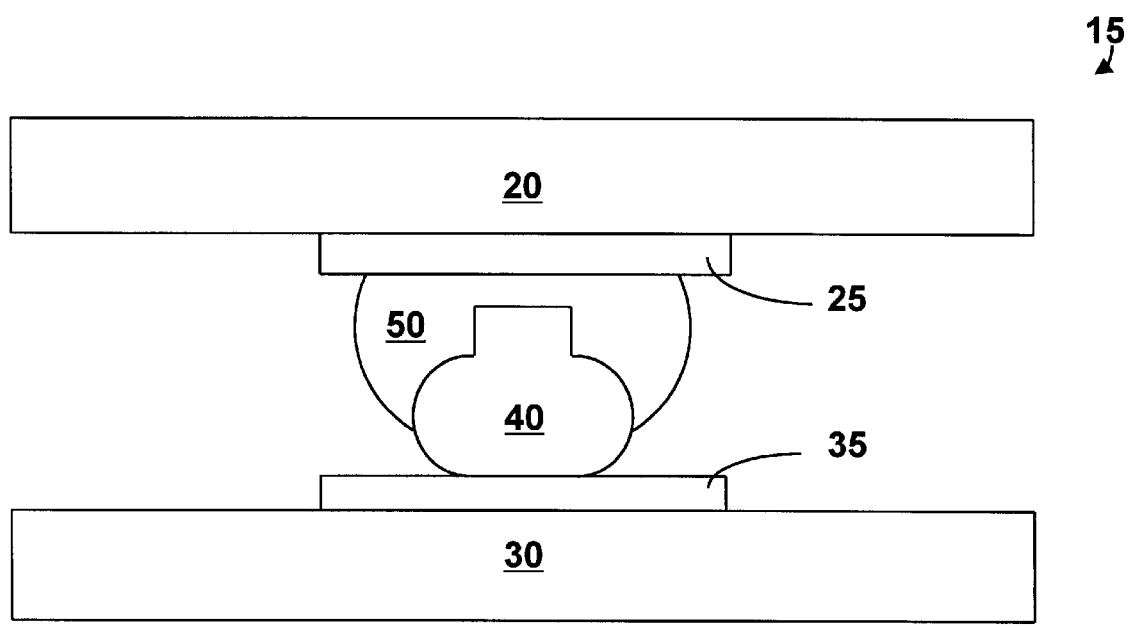
FIG. 2 is a cross-section of a bonded electronic component in accordance with a second embodiment of the present invention.

FIG. 2 illustrates an exemplary bonded electronic component similar to FIG. 1, except that component connector 40 (also known as a test head in this arrangement) is located on substrate 30 instead of electronic component 20. In this example, substrate 30 may be used to test many different electronic components and then, once the testing is finished and conductive material 50 is dissolved, each electronic component 20 may use its own specific electrical connection, such as wirebond, C4 connections, etc.

Figure 3:
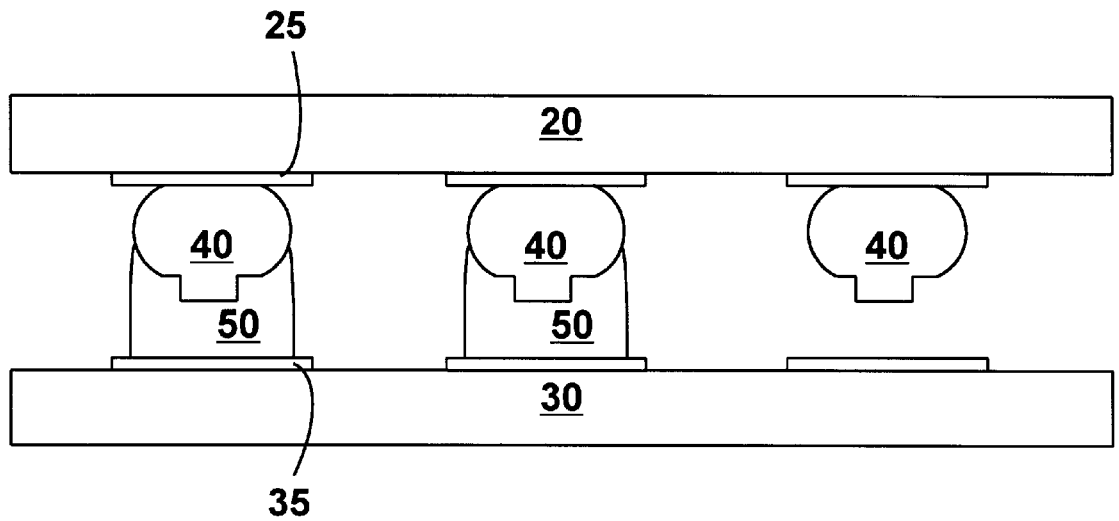
FIGS. 3 and 4 are cross-sections of a bonded and processed electronic component of FIG. 1 in accordance with the preferred embodiment of the present invention.
Figure 4:
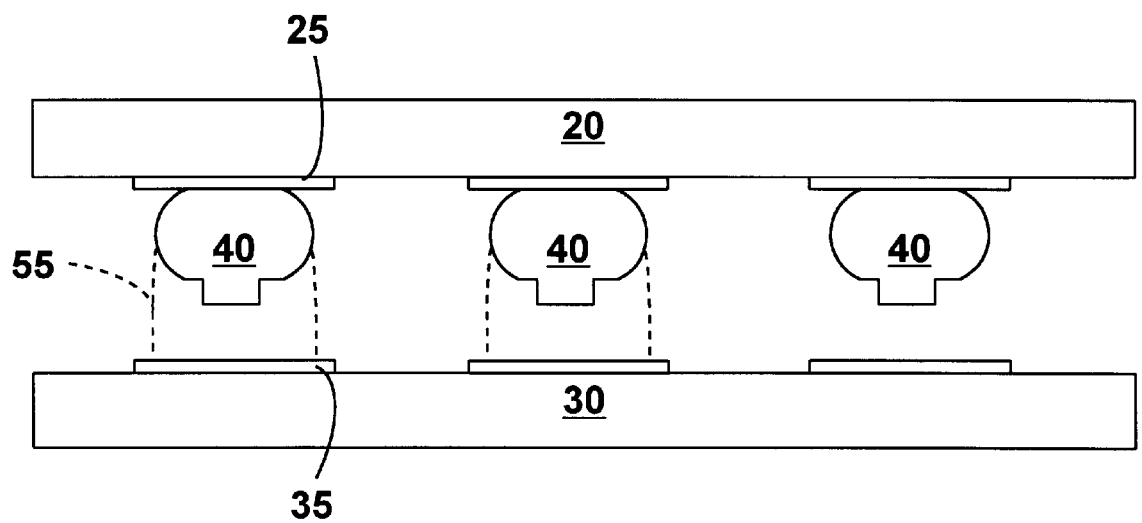

As seen in FIGS. 3 and 4, conductive material 50 is provided on selected ones of a plurality of metallized pads 35 (FIG. 3), then dissolved 55 (FIG. 4) after testing and burn-in is accomplished. Thus, as seen in FIG. 4, with the dissolving of conductive material 50, electronic component 20 is detached from the substrate 30. In this example, electronic component 20 is a wafer having a plurality of integrated circuit chips (not shown), which are not diced-up. Although testing may be done on a wafer-level, it is to be understood that the present invention may also be used for diced-up chips. Component connectors 40 are formed on electronic component 20 as discussed in reference to FIG. 1.

Based on the test data collected, electronic component 20 may undergo repair or rework to correct defects or failures found during the test. Once electronic component 20 tests acceptably the wafer can be diced. The circuit chips with the component connectors 40 can then be bonded to chip carriers by once again applying the conductive material 50 to the carrier, bonding the conductive material at greater than approximately 220 degrees Celsius (C) and then underfilling. An underfill, which may be reworkable, may be used if desired. The component connector 40 and conductive material 50 will form a short interconnection (e.g., approximately between 0.002" to 0.004") between the chip and the carrier, much shorter than a conventional wire bond interconnection. One advantage of using selective connections between electronic component 20 and substrate 30 includes the ability to fully test component 20 without interconnecting all the metallized pads on electronic component 20. That is, many test algorithms do not need to test every metallized pad, thus time and material are conserved through the process as described in accordance with the present invention. Also, known defective circuits on electronic component 20 may be avoided through the selectivity of the conductive material applied to metallized pads 25.

Figure 5:
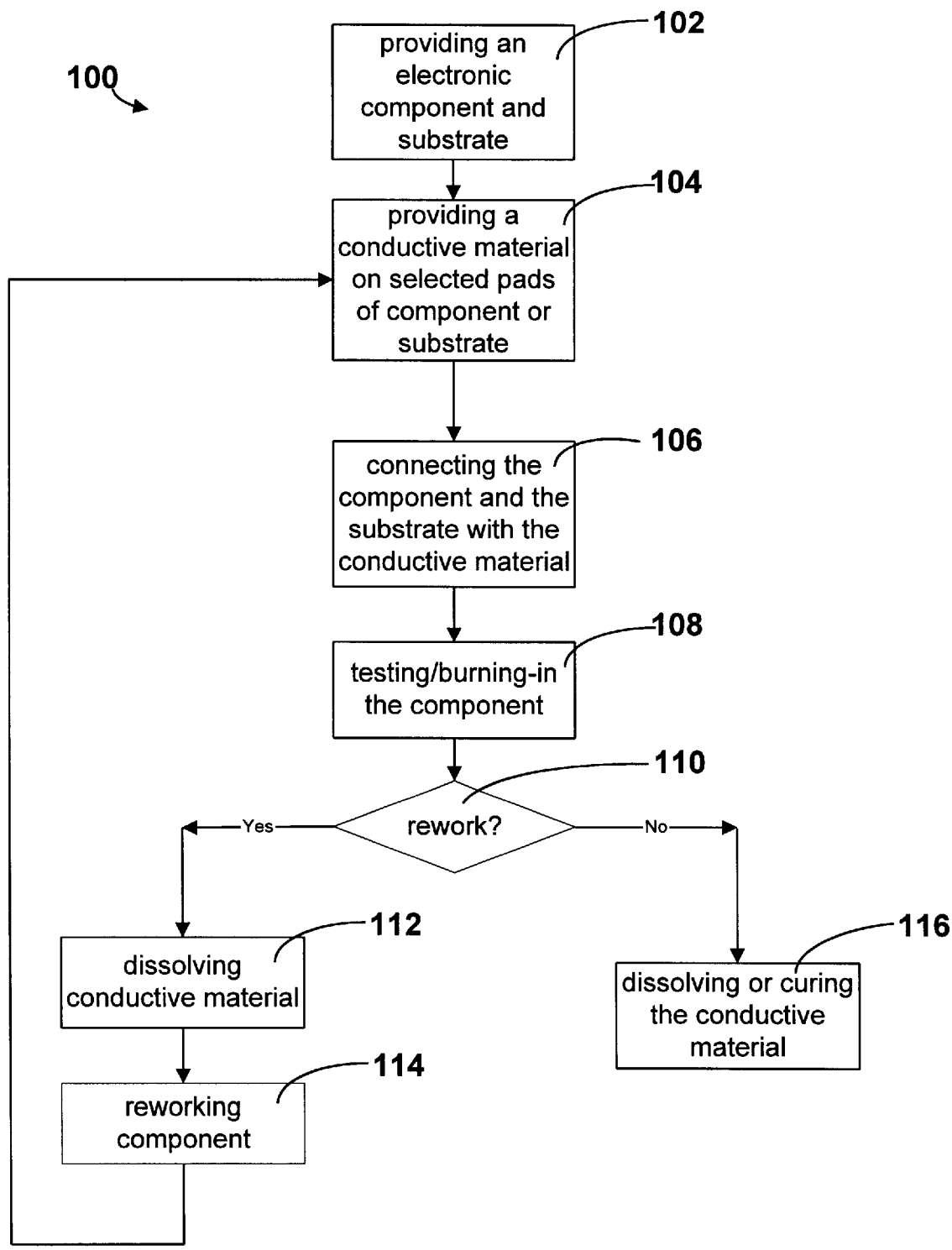
FIG. 5 is a flowchart illustrating the method of processing the electronic component of FIGS. 3 and 4.

As seen in FIG. 5, the first step in flowchart 100 for processing an electronic component is providing an electronic component having a plurality of metallized pads for external connection and providing a substrate for connection to the electronic component (step 102). The substrate has metallized pads corresponding to each of the metallized pads of the electronic component. If Built-In-Self-Test (BIST) is part of the chip design, then test, burn-in or both test and burn-in patterns are generated on each chip. In this case, the number of substrate pads may be less than those of the chip since they only connect to the BIST engine and to corresponding power and ground connections. Then, a conductive material is provided on selected ones of the plurality of metallized pads of the electronic component or the substrate (step 104). The component and the substrate are connected with the conductive material (step 106), forming a bonded component. After this step, a reworkable underfill may be added to the bonded component to provide mechanical support. The bonded component is then tested/burned-in (step 108). If the component needs rework or repair (step 110=yes), then the conductive material is dissolved (step 112), and the component is reworked/repaired (step 114). Conductive material is then used (step 104) to reconnect the component and the substrate (step 106), and the bonded component is retested (step 108). Steps 104–114 may be repeated until the component is found acceptable (step 110=no). At that point, when no more rework is desired (step 110=no), the conductive material is dissolved or cured depending on the desired applications of the electronic component (step 116).

Figure 6:
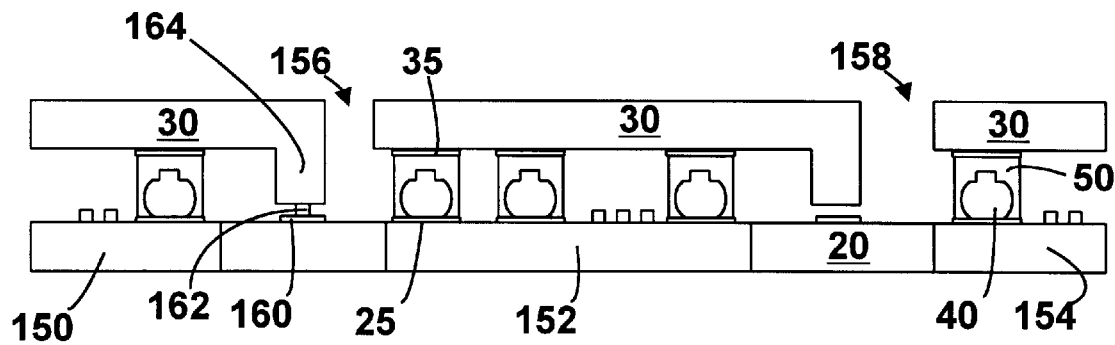
FIG. 6 is a cross-section of processed electronic component of FIG. 1.
Figure 7:
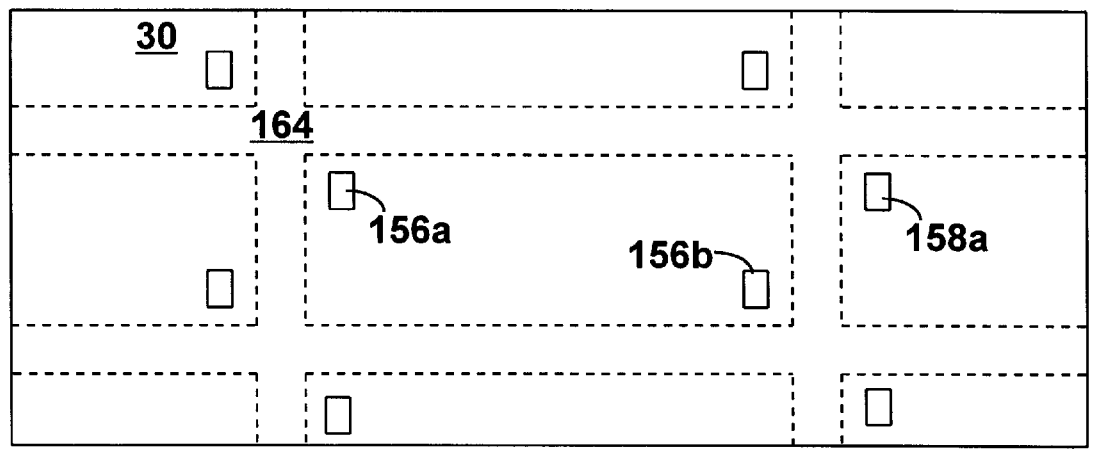
FIG. 7 is a plan view of FIG. 6.

During wafer test, and especially during wafer level burn-in (step 108), common chip-to-chip pad connections are used to simplify substrate wiring. One or more chip pads may short during burn-in stress, preventing completion of the burn-in cycle. The ability to selectively dissolve the conductive material 50 of the shorted chip, or for several chips, allows burn-in to resume without separating the wafer from the substrate. FIGS. 6 and 7 illustrate an approach to selective chip disconnect using a solvent.

The cross-section in FIG. 6 shows the electronic component 20, with conductive material 50. Chip regions 150, 152 and 154 are temporarily attached to metallized pads 35 on substrate 30. Openings 156 and 158 in the substrate are used to selectively introduce a solvent that can dissolve conductive material 50. FIG. 7 shows a top view of the substrate and electronic component assembly. To electrically disconnect chip 152 connections to substrate 30, solvent flows into opening 156a and exits from 156b, for example. Similarly, chip 154 may be disconnected using openings 158a and 158b (not shown in FIG. 7). A solvent dispensing tool as part of a robot assembly with x-y axis controls can be used to disconnect one or more chips without detaching the electronic component 20 from the substrate 30. The electronic component and substrate assembly may be removed from the burn-in chamber to disconnect a chip with the electronic component in place. The substrate openings, such as 156a, 156b, and 158a are positioned so as not to interfere with the substrate wiring connections.

In order to confine the solvent to a single chip region, the chip must be surrounded by a barrier. FIG. 7 shows a substrate design with a barrier region 164. The barrier may use pressure on the electronic component 20 to contain the solvent. FIG. 6 shows an alternative means in which a barrier ring 160, in the kerf region between chip sites, surrounds the individual chip sites. A connecting material 162 temporarily forms the barrier required to isolate each chip from the solvent applied to an adjacent chip. Chip region 150, for example, isolated from adjacent chip region 152. The barrier temporary attach material 162 must be insensitive to the solvent used to disconnect the chip from the substrate. The barrier temporary attach material may be material such as thermoplastic material, solder, or a soft material such as gold, etc. The separation may be removed by heating to a temperature above burn-in (e.g., 150 degrees C). Separation may be achieved using another solvent material, etc.

Thus, the present invention allows for selective connections between electronic components, such as a wafer, and substrates using conductive material, to efficiently test a complete wafer without having to electrically connect all pads of the wafer to the substrate. Furthermore, the present invention allows for rework and repair of a wafer at the wafer-level. In addition, the conductive material may also be used in a permanent package, since the conductive material of the present invention provides complete electrical conductivity and connection between the electronic component and the substrate. Also, the present invention allows for selective elimination of conductive material between electronic components, such as a wafer, in case of high electrical leakage or shorting of a chip terminal or terminals during burn-in.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A method of processing an electronic component comprising the steps of:
   a) providing an electronic component having a plurality of pads for external connection;
   b) providing a substrate for connection to said electronic component, said substrate comprising pads corresponding to each said pad of said electronic component;
   c) providing a dissolvable conductive material on selected ones of said plurality of pads of said component or said substrate; and
   d) connecting said selected pads of said component and said substrate through said dissolvable conductive material.

2. The method of claim 1, wherein said electronic component comprises a wafer having a plurality of integrated circuit chips.

3. The method of claim 2, wherein said dissolvable conductive material is not provided on shorted chips.

4. The method of claim 1, wherein said substrate comprises a test head for testing or burning-in said wafer.

5. The method of claim 1, wherein said dissolvable conductive material is a thermoplastic.

6. The method of claim 1, wherein said dissolvable conductive material is used in combination with another probe for said connection.

7. The method of claim 1, wherein said dissolvable conductive material is isotropic.

8. The method of claim 1, further comprising the steps of:
   e) testing and burning-in said electronic component; and
   f) repairing and retesting said electronic component if results of said testing are unacceptable.

9. The method of claim 8, wherein step e) further comprises:
   dissolving said dissolvable conductive material from only selected pads for testing or burning-in.

10. The method of claim 3, further comprising the steps of:
    e) testing and burning-in said electronic component; and
    f) repairing and retesting said electronic component if results of said testing are unacceptable.

11. An apparatus comprising:
    an electronic component having a plurality of pads for external connection;
    a substrate for connection to said electronic component, said substrate having pads corresponding to each said pad of said electronic component;
    a dissolvable conductive material on selected ones of said plurality of pads of said component or said substrate,
    wherein said selected pads of said component and said substrate are connected through said dissolvable conductive material.

12. The apparatus of claim 11, wherein said electronic component comprises:
    a wafer having a plurality of integrated circuit chips.

13. The apparatus of claim 12, wherein said plurality of integrated circuit chips are not diced up.

14. The apparatus of claim 12, wherein said plurality of integrated circuit chips are diced up.

15. The apparatus of claim 11, wherein said substrate comprises:
    a test head for testing or burning-in said wafer.

16. The apparatus of claim 11, wherein said dissolvable conductive material is a thermoplastic.

17. The apparatus of claim 11, wherein said dissolvable conductive material is used in combination with another probe for said connection.

18. The apparatus of claim 11, wherein said dissolvable conductive material is isotropic.

* * * * *